United States Patent
Lin et al.

(10) Patent No.: US 9,269,645 B1
(45) Date of Patent: Feb. 23, 2016

(54) FAN-OUT WAFER LEVEL PACKAGE

(71) Applicant: UNITED MICROELECTRONICS CORP., Hsinchu (TW)

(72) Inventors: Chu-Fu Lin, Kaohsiung (TW); Chien-Li Kuo, Hsinchu (TW); Kuo-Ming Chen, Hsinchu County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 14/521,893

(22) Filed: Oct. 23, 2014

(30) Foreign Application Priority Data

Aug. 28, 2014 (CN) .......................... 2014 1 0430514

(51) Int. Cl.
*H01L 23/40* (2006.01)
*H01L 23/34* (2006.01)
*H01L 23/522* (2006.01)
*H01L 23/00* (2006.01)

(52) U.S. Cl.
CPC .............. *H01L 23/34* (2013.01); *H01L 23/522* (2013.01); *H01L 24/14* (2013.01); *H01L 2023/405* (2013.01); *H01L 2023/4037* (2013.01); *H01L 2023/4043* (2013.01); *H01L 2023/4062* (2013.01); *H01L 2924/014* (2013.01)

(58) Field of Classification Search
CPC .............. H01L 2023/4037; H01L 2023/4043; H01L 2023/405; H01L 2023/4062
See application file for complete search history.

(56) References Cited

U.S. PATENT DOCUMENTS

| | | | | |
|---|---|---|---|---|
| 6,469,897 B2 * | 10/2002 | Ho | .......................... | H01L 23/36 174/264 |
| 2011/0156240 A1 * | 6/2011 | Luan | ..................... | H01L 21/561 257/692 |
| 2011/0156250 A1 * | 6/2011 | Goh | ........................ | H01L 25/16 257/738 |
| 2012/0032314 A1 * | 2/2012 | Chen | ..................... | H01L 21/563 257/666 |
| 2012/0038043 A1 * | 2/2012 | Jin | .................... | H01L 23/49811 257/737 |
| 2012/0119391 A1 * | 5/2012 | Koizumi | ............... | H01L 21/561 257/782 |
| 2012/0153507 A1 * | 6/2012 | Miki | ..................... | H01L 21/568 257/782 |
| 2012/0313253 A1 | 12/2012 | Nakadaira et al. | | |
| 2014/0327157 A1 * | 11/2014 | Aoi | ..................... | H01L 23/3114 257/777 |
| 2015/0270233 A1 * | 9/2015 | Vincent | ................... | H01L 24/02 257/773 |

* cited by examiner

*Primary Examiner* — Ida M Soward
(74) *Attorney, Agent, or Firm* — WPAT, PC; Justin King

(57) ABSTRACT

A fan-out wafer level package is provided. The fan-out wafer level package includes a semiconductor element, a molding compound, a first fan-out structure, a conductive heat spreader, and a plurality of solder balls. The semiconductor element includes a plurality of bonding pads. The molding compound covers the semiconductor element. The first fan-out structure is formed on the semiconductor element, wherein the first fan-out structure has a plurality of fan-out contacts electrically connected to the bonding pads. The conductive heat spreader is formed on the first fan-out structure, wherein the conductive heat spreader has a plurality of through holes filled with a conductive material. The solder balls are formed on the conductive heat spreader, wherein the solder balls are electrically connected to the first fan-out structure via the through holes filled with the conductive material.

15 Claims, 3 Drawing Sheets

US 9,269,645 B1

FAN-OUT WAFER LEVEL PACKAGE

This application claims the benefit of People's Republic of China Application Serial No. 201410430514.0, filed Aug. 28, 2014, the subject matter of which is incorporated herein by reference.

BACKGROUND

1. Technical Field

The disclosure relates in general to a fan-out wafer level package, and more particularly to a fan-out wafer level package having excellent heat dissipation effects.

2. Description of the Related Art

Recently, fan-out wafer level packages (FOWLP) have been popularly applied in making semiconductor chips due to the high performance and low cost requirements provided therefrom. For example, 28 nm node wafers have utilized FOWLP technology as a solution for mobile products.

However, there are still some issues, such as heat dissipation and structural delamination; therefore, there is always a continuing need to provide an improved FOWLP with reliable performances.

SUMMARY OF THE INVENTION

The disclosure is directed to a fan-out wafer level package. According to the embodiments of the present disclosure, the conductive heat spreader is formed on the first fan-out structure, which is advantageous to enhancing the overall heat dissipation effects, and hence the overall stability of the fan-out wafer level package is increased.

According to an embodiment of the present disclosure, a fan-out wafer level package is disclosed. The fan-out wafer level package includes a semiconductor element, a molding compound, a first fan-out structure, a conductive heat spreader, and a plurality of solder balls. The semiconductor element includes a plurality of bonding pads. The molding compound covers the semiconductor element. The first fan-out structure is formed on the semiconductor element, wherein the first fan-out structure has a plurality of fan-out contacts electrically connected to the bonding pads. The conductive heat spreader is formed on the first fan-out structure, wherein the conductive heat spreader has a plurality of through holes filled with a conductive material. The solder balls are formed on the conductive heat spreader, wherein the solder balls are electrically connected to the first fan-out structure via the through holes filled with the conductive material.

The disclosure will become apparent from the following detailed description of the preferred but non-limiting embodiments. The following description is made with reference to the accompanying drawings.

DETAILED DESCRIPTION OF THE INVENTION

Figure 1:
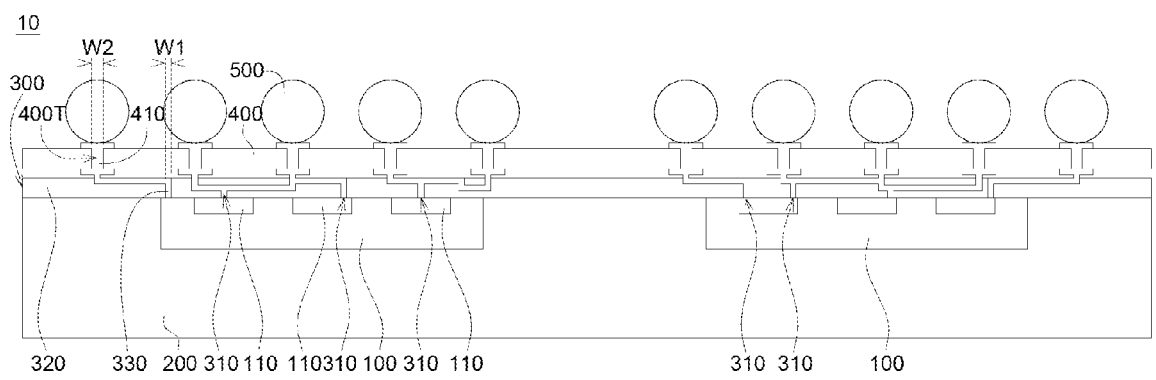
FIG. 1 is a schematic view of a fan-out wafer level package according to an embodiment of the present disclosure.

According to the embodiments of the present disclosure, in the fan-out wafer level package, the conductive heat spreader is formed on the first fan-out structure, which is advantageous to enhancing the overall heat dissipation effects, and hence the overall stability of the fan-out wafer level package is increased. The identical or similar elements of the embodiments are designated with the same reference numerals. It is to be noted that the drawings are simplified for clearly describing the embodiments, and the details of the structures of the embodiments are for exemplification only, not for limiting the scope of protection of the disclosure. Ones having ordinary skills in the art may modify or change the structures according to the embodiments of the present disclosure.

FIG. 1 is a schematic view of a fan-out wafer level package 10 according to an embodiment of the present disclosure. The fan-out wafer level package 10 includes a semiconductor element 100, a molding compound 200, a first fan-out structure 300, a conductive heat spreader 400, and a plurality of solder balls 500. The two semiconductor elements 100 as shown in FIG. 1 may be two identical semiconductor elements or two different semiconductor elements. The terms of "identical" and "different" refer to the functions, the areas, the thickness, or the manufacturing technique generations (e.g. 90 nm, 65 nm, and 28 nm manufacturing technique generations) of the semiconductor elements. The semiconductor element 100 includes a plurality of bonding pads 110, and the molding compound 200 covers the semiconductor element 100. The first fan-out structure 300 is formed on the semiconductor element 100, wherein the first fan-out structure 300 has a plurality of fan-out contacts 310 electrically connected to the bonding pads 110. The conductive heat spreader 400 is formed on the first fan-out structure 300, wherein the conductive heat spreader 400 ha a plurality of through holes 400T filled with a conductive material 410. The solder balls 500 are formed on the conductive heat spreader 400, wherein the solder balls 500 are electrically connected to the first fan-out structure 300 via the through holes 400T filled with the conductive material 410.

According to the embodiments of the present disclosure, the conductive heat spreader 400 formed on the first fan-out structure 300 is advantageous to enhancing the overall heat dissipation effects. As the heat dissipation effects are effectively enhanced, the delamination of multi-layered structures in the fan-out wafer level package resulted from different levels of deformation of the multi-layered structures caused by heat does not occur easily. As such, the overall stability of the fan-out wafer level package is increased.

Moreover, the first fan-out structure 300 has a plurality of electrical contacts for electrically connected to elements outside the first fan-out structure 300, such as fan-out contacts 310. These electrical contacts are weak points in the manufacturing process. While the structures of the electrical contacts directly connect external elements, such as the solder balls 500, failures may occur during the manufacturing process, and hence the process yield of the whole fan-out wafer level package is affected. However, according to the embodiments of the present disclosure, the solder balls 500 are electrically connected to the first fan-out structure 300 via the through holes 400T filled with the conductive material 410, such that the circumstance of the first fan-out structure 300 connected to the solder balls 500 via weak points can be prevented, and thus the strength and the stability of the structure is effectively increased.

In the embodiments, the through holes 400T are manufactured by such as a laser drilling process, a mechanical drilling process, and/or an etching process, followed by filling the conductive material 410 in the through holes 400T. The conductive material 410 may be filled in the through holes 400T by such as an electroplating process, and the conductive material 410 electrically connects the solder balls 500 to the bonding pads 110.

In an embodiment, the conductive heat spreader 400 is such as a silicon interposer, and the through holes 400T filled with the conductive material 410 are such as through silicon vias (TSVs).

Figure 2:
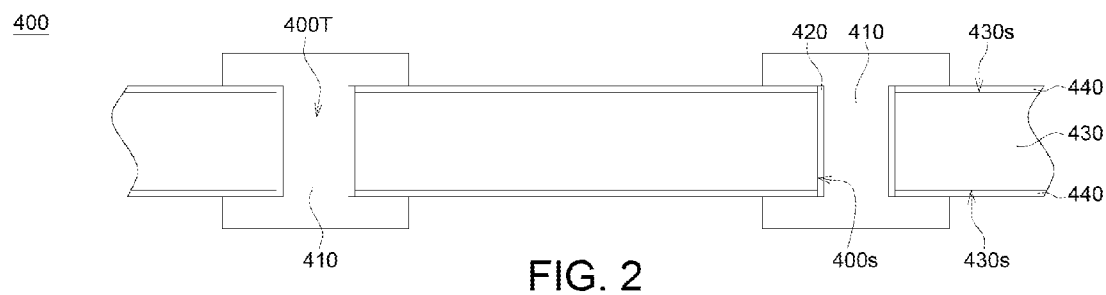
FIG. 2 is a partial schematic view of a conductive heat spreader according to an embodiment of the present disclosure.

FIG. 2 is a partial schematic view of a conductive heat spreader 400 according to an embodiment of the present disclosure. As shown in FIG. 2, in the embodiment, the conductive heat spreader 400 may include a plurality of insulation layers 420. The insulation layers 420 are formed between the sidewalls 400s of the through holes 400T, which are filled with the conductive material 410, and the conductive material 410. In the embodiment, the insulation layers 420 are such as oxide layers or nitride layers.

As shown in FIG. 2, in the embodiment, the conductive heat spreader 400 may include a conductive layer 430. The conductive layer 430 may include at least one of silicon, copper, or aluminum.

As shown in FIG. 2, in the embodiment, the conductive heat spreader 400 may further include two oxide layers 440. The two oxide layers 400 are formed on two opposite surfaces 430s of the conductive layer 430, respectively. The two oxide layers 440 and the insulation layer on the sidewall 400s may be the same insulating layer formed by the same manufacturing process.

As shown in FIG. 1, in the embodiment, the first fan-out structure 300 may further include an organic dielectric layer 320 and a plurality of fan-out wires 330. The fan-out wires are formed in the organic dielectric layer 320. The fan-out wires 330 of the first fan-out structure 300 expand outwards, which helps to enlarge the pitch between the solder balls 500. The enlargement of the pitch can increase the contact space between the whole structure and air, such that the heat dissipation effects can be improved.

In some embodiments, the first fan-out structure 300 may further include at least one passive component (not shown in drawings). The passive component is formed in the organic dielectric layer 320. In the embodiments, the passive component is such as a capacitor, a resistor, an inductor, and etc.

In the embodiments, the organic dielectric layer 320 includes an organic dielectric material. The organic dielectric layer 320 may be manufactured by such as a CVD process, a spray coating process, or a molding process.

As shown in FIG. 1, the fan-out wires have a first line width W1, and the through holes 400T filled with the conductive material 410 have a second line width W2. In a case where the through holes 400T are circle-shaped in layout view, the second line width W2 is the diameter of a through hole 400T. In the embodiment, the second line width W2 is such as larger than the first lien width W1. The fan-out wires 330 of the first fan-out structure 300 has winding patterns in the organic dielectric layer 320, as such, the first line width W1 is relatively thin. On the other hand, the through holes 400T filled with the conductive material 410 are vertically arranged without any lateral extending structure, as such, the second line width W2 is relatively thick. Accordingly, the manufacture of the through holes 400T does not require a very delicate manufacturing process; moreover, the large cross-section (that is, the second line width W2) provides superior heat dissipation effects.

In some embodiments, the material of the bonding pads is a conductive material, such as including aluminum. In an embodiment, the solder balls 500 can form as a ball grid array (BGA).

Figure 3:
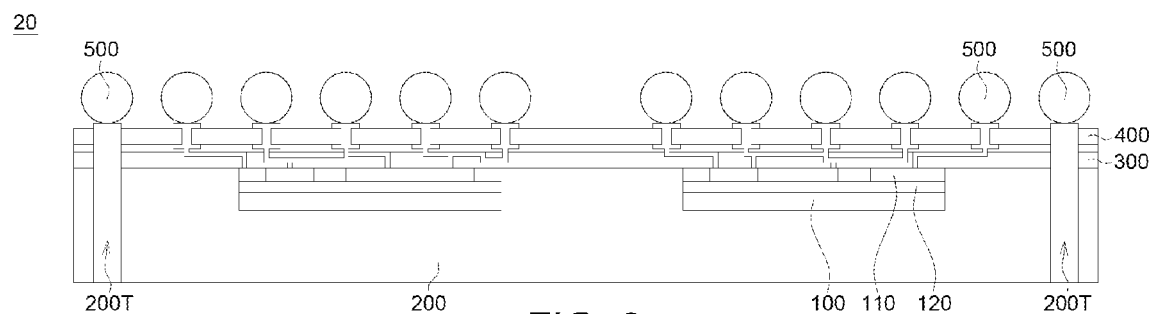
FIG. 3 is a schematic view of a fan-out wafer level package according to another embodiment of the present disclosure.

FIG. 3 is a schematic view of a fan-out wafer level package 20 according to another embodiment of the present disclosure. The elements in the present embodiment sharing the same labels with those in the previous embodiment are the same elements, and the description of which is omitted.

As shown in FIG. 3, the fan-out wafer level package 20 may further include a through molding via) 200T. The through molding via 200T is formed in the molding compound 200. The through molding via 200T is electrically connected to at least one of the solder balls 500. In the embodiment, the through molding via 200T is filled with a conductive material. As the fan-out wafer level package 20 is stacked and connected to additional packages, the through molding via 200T is used as the electrical connection between the packages. In the present embodiment, as shown in FIG. 3, the two through molding vias 400T penetrate through the molding compound 200, the first fan-out structure 300, and the conductive heat spreader 400 for electrically connecting to two different solder balls 500, respectively.

As shown in FIG. 3, the semiconductor element 100 may further include an interconnection structure 120 formed on the bonding pads 110. As shown in FIG. 3, the interconnection structure 120 is such as in direct contact with the bonding pads 110, and the bonding pads 110 are located between the interconnection structure 120 and the first fan-out structure 300. In the embodiment, the interconnection structure 120 may has multi-layers of electrical connection lines and dielectric materials, and the dielectric materials separated the electrical connection lines from one another.

Figure 4:
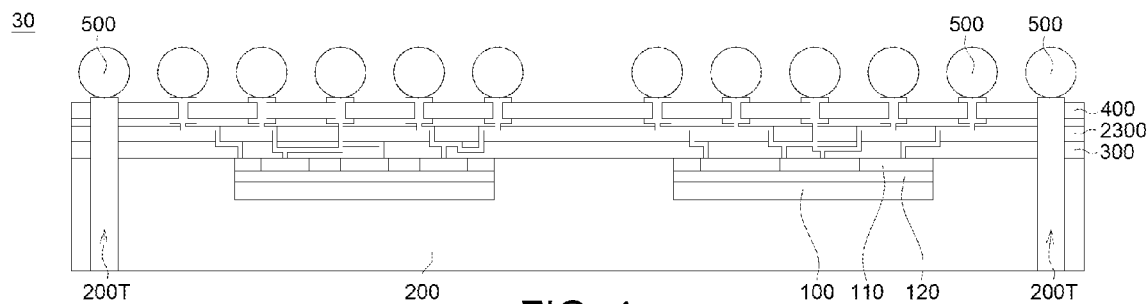
FIG. 4 is a schematic view of a fan-out wafer level package according to a further embodiment of the present disclosure.

FIG. 4 is a schematic view of a fan-out wafer level package 30 according to a further embodiment of the present disclosure. The elements in the present embodiment sharing the same labels with those in the previous embodiments are the same elements, and the description of which is omitted.

As shown in FIG. 4, the fan-out wafer level package 30 may further include a second fan-out structure 2300. The second fan-out structure 2300 is formed on the conductive heat spreader 400, and the first fan-out structure 300 is electrically connected to the second fan-out structure 2300.

In the present embodiment, the second fan-out structure 2300 is electrically connected to the solder balls 500. The pitch between the solder balls 500 may be further enlarged by additionally disposing the second fan-out structure 2300; as such, the line widths and the distances between lines can be further enlarged laterally, which can further increase the heat dissipation effects of the whole structure.

Figure 5:
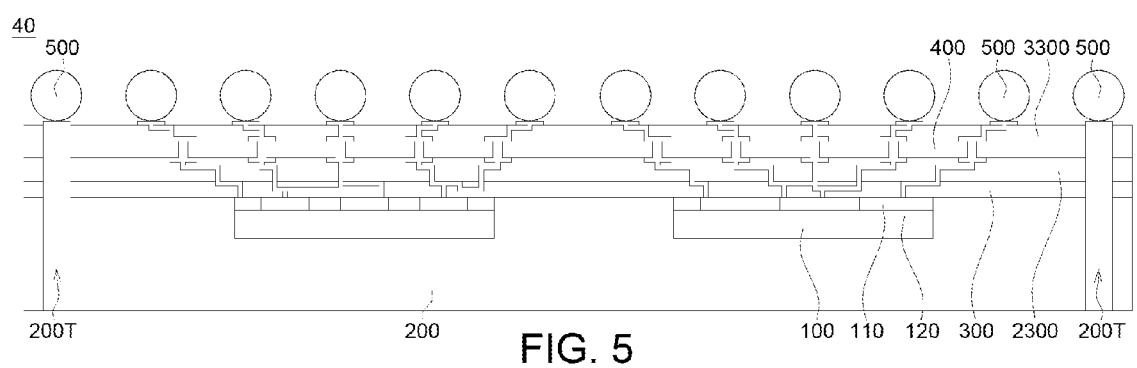
FIG. 5 is a schematic view of a fan-out wafer level package according to a still embodiment of the present disclosure.

FIG. 5 is a schematic view of a fan-out wafer level package 40 according to a still embodiment of the present disclosure. The elements in the present embodiment sharing the same labels with those in the previous embodiments are the same elements, and the description of which is omitted.

As shown in FIG. 5, the fan-out wafer level package 40 may further include a third fan-our structure 3300. The third fan-out structure 3300 is formed on the conductive heat spreader 400.

In the present embodiment, the second fan-out structure 2300 and the third fan-out structure 3300 are formed on two opposite surfaces of the conductive heat spreader 400, and the third fan-out structure 3300 is electrically connected to the second fan-out structure 2300.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A fan-out wafer level package, comprising:
   a semiconductor element comprising a plurality of bonding pads;
   a molding compound covering the semiconductor element;
   a first fan-out structure formed on the semiconductor element, wherein the first fan-out structure has a plurality of fan-out contacts electrically connected to the bonding pads;
   a conductive heat spreader formed on the first fan-out structure, wherein the conductive heat spreader has a plurality of through holes filled with a conductive material; and
   a plurality of solder balls formed on the conductive heat spreader, wherein the solder balls are electrically connected to the first fan-out structure via the through holes filled with the conductive material.

2. The fan-out wafer level package according to claim 1, wherein the conductive heat spreader comprises a plurality of insulation layers formed between sidewalls of the through holes and the conductive material.

3. The fan-out wafer level package according to claim 1, wherein the conductive heat spreader comprises a conductive layer, wherein the conductive layer comprises at least one of silicon, copper, or aluminum.

4. The fan-out wafer level package according to claim 3, wherein the conductive heat spreader further comprises two oxide layers formed on two opposite surfaces of the conductive layer, respectively.

5. The fan-out wafer level package according to claim 1, wherein the first fan-out structure comprises:
   an organic dielectric layer; and
   a plurality of fan-out wires formed in the organic dielectric layer.

6. The fan-out wafer level package according to claim 5, wherein the fan-out wires are electrically connected to the fan-out contacts of the first fan-out structure.

7. The fan-out wafer level package according to claim 5, wherein the fan-out wires have a first line width, the through holes filled with the conductive material have a second line width larger than the first line width.

8. The fan-out wafer level package according to claim 5, wherein the first fan-out structure further comprises:
   at least a passive component formed in the organic dielectric layer.

9. The fan-out wafer level package according to claim 1, further comprising:
   a second fan-out structure formed on the conductive heat spreader, wherein the first fan-out structure is electrically connected to the second fan-out structure.

10. The fan-out wafer level package according to claim 9, wherein the second fan-out structure is electrically connected to the solder balls.

11. The fan-out wafer level package according to claim 9, further comprising:
    a third fan-out structure formed on the conductive heat spreader, wherein the second fan-out structure and the third fan-out structure are formed on two opposite surfaces of the conductive heat spreader, respectively, and the third fan-out structure is electrically connected to the second fan-out structure.

12. The fan-out wafer level package according to claim 1, wherein the bonding pads comprise aluminum.

13. The fan-out wafer level package according to claim 1, wherein the solder balls are formed as a ball grid array (BGA).

14. The fan-out wafer level package according to claim 1, further comprising:
    at least a through molding via formed in the molding compound, wherein the through molding via is electrically connected to at least one of the solder balls.

15. The fan-out wafer level package according to claim 1, wherein the semiconductor element further comprises a dielectric structure formed on the bonding pads.

\* \* \* \* \*